United States Patent
Bolle et al.

(10) Patent No.: US 7,932,727 B2
(45) Date of Patent: Apr. 26, 2011

(54) TEST STRUCTURE TO MONITOR THE RELEASE STEP IN A MICROMACHINING PROCESS

(76) Inventors: Christian Bolle, Bridgewater, NJ (US); Flavio Pardo, New Providence, NJ (US)

(*) Notice: Subject to any disclaimer, the term of this patent is extended or adjusted under 35 U.S.C. 154(b) by 361 days.

(21) Appl. No.: 12/058,859

(22) Filed: Mar. 31, 2008

(65) Prior Publication Data
US 2009/0243625 A1    Oct. 1, 2009

(51) Int. Cl.
*G01R 31/08* (2006.01)
*G01R 27/00* (2006.01)
*H01L 21/66* (2006.01)

(52) U.S. Cl. .............. 324/525; 438/17; 702/65
(58) Field of Classification Search .......... 324/525, 324/512, 500, 555, 691, 649, 600, 76.11; 702/65, 64, 57, 1, 116, 108, 127; 438/17, 438/14
See application file for complete search history.

(56) References Cited

U.S. PATENT DOCUMENTS

| | | | | |
|---|---|---|---|---|
| 3,763,430 A * | 10/1973 | Terrey | ............ | 324/500 |
| 6,403,979 B1 * | 6/2002 | Kadosh et al. | .......... | 257/48 |
| 7,045,371 B2 * | 5/2006 | Goto | ............. | 438/16 |
| 2007/0143048 A1 * | 6/2007 | Yamaguchi et al. | ...... | 702/65 |
| 2010/0065847 A1 * | 3/2010 | Gotou et al. | ............ | 257/59 |

* cited by examiner

*Primary Examiner* — Hoai-An D Nguyen
(74) *Attorney, Agent, or Firm* — Brosemer, Kolefas & Associates

(57) ABSTRACT

Electrical and visual test structures monitor the degree of removal of conductive sacrificial layers used in micromachining processes that fabricate micro-electromechanical systems (MEMS).

6 Claims, 9 Drawing Sheets

Side view

TEST STRUCTURE TO MONITOR THE RELEASE STEP IN A MICROMACHINING PROCESS

FIELD OF THE INVENTION

This disclosure relates to micromachining processes used to make micro-electromechanical systems (MEMS). More specifically, this disclosure relates to monitoring the removal of a sacrificial layer in a process of making one or more MEMS devices.

BACKGROUND OF THE INVENTION

A current process to manufacture MEMS devices, such as micro-machined relays, involves the steps of depositing and patterning a copper or other electrically conductive sacrificial layer on a substrate, depositing and patterning a nickel or other electrically conductive structural layer at least partially over the sacrificial layer, and depositing and patterning a polymer insulating structural layer over the nickel structural layer. Then the copper sacrificial layer is removed to release the micro-machined parts. Since the copper is an electric conductor, incomplete etching of the copper can cause undesired electric shorts in the system in addition to preventing the structures from moving.

SUMMARY OF THE INVENTION

A test structure, preferably, but not limited to, an electrical test structure, which allows for simple monitoring of the degree of removal of the conductive sacrificial layers used in micromachining processes would alleviate the problem identified above.

In one example of the invention, a micro-electromechanical test apparatus comprises an insulating substrate. A first conductive structural element has a first anchor portion fixed to the substrate and a first bridge portion cantilevered from the anchor portion over the substrate. A second conductive structural element is insulated from the first conductive structural element and has a second anchor portion fixed to the substrate and a second bridge portion cantilevered from the second anchor portion over the substrate. An electrical resistance measuring device connected to the first and second conductive structural elements detects the presence of an incompletely removed conductive sacrificial layer contacting the first and second conductive structural elements.

In a preferred example of the invention, the first bridge portion comprises a first plurality of conductive fingers and the second bridge portion comprises a second plurality of conductive fingers interleaved with the first plurality of conductive fingers. In other examples of the invention, an insulating structural layer is situated between the first and second bridge portions.

In one specific example of the invention involving electrical monitoring of the degree of removal, a test structure is defined by a pair of interdigitated nickel fingers covered by a polymer layer. Initially, the pairs of interdigitated fingers are electrically connected by the copper sacrificial layer. Once the copper layer is completely removed this electrical connection is broken. The polymer layer covering the fingers region is used to produce a broader structure that takes longer to underetch or undercut. It is also possible to create a test structure that permits a visual inspection of the extent to which a sacrificial layer has been removed. In this case, a transparent polymer structure can be used if only a visual test structure is desired.

DETAILED DESCRIPTION

Figure 1:
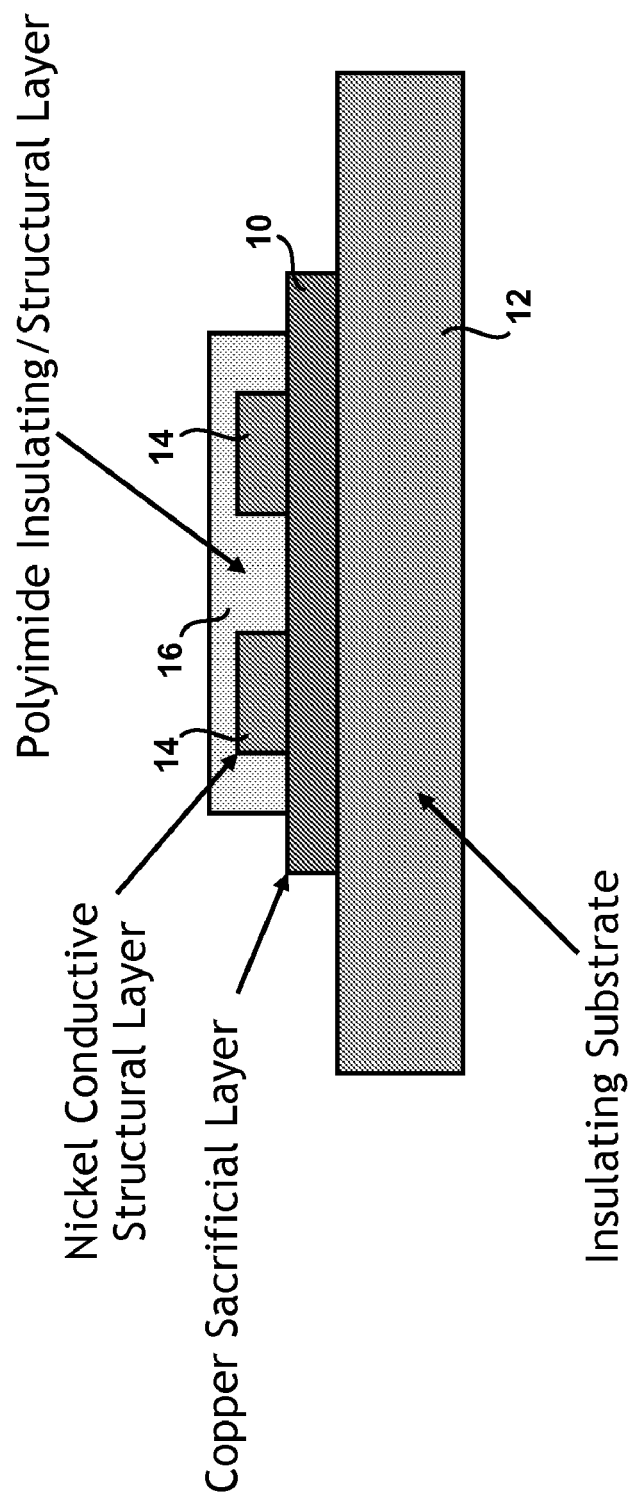
FIG. 1 depicts an illustrative partially completed structure formed in a typical micromachining process involving the use of sacrificial layers.

FIG. 1 depicts a partially completed structure made in accordance with a micro-machining process used to fabricate MEMS devices. The process involved the deposition of a conductive sacrificial layer 10 on a non-conductive substrate 12. The conductive sacrificial layer 10 illustratively may be made of an electrically conductive material such as copper. A conductive structural layer 14 is deposited over the sacrificial layer 10 and the substrate 12. The conductive structural layer 14 illustratively may be made of an electrically conductive material such as nickel. A non-conductive layer 16 is deposited over the conductive structural layer 14. The non-conductive layer 16 illustratively may be made of a polymer such as polyimide. The sacrificial layer 10 is subsequently removed to release the portions of the conductive layer 14 shown in FIG. 1 so that those portions of the layer 14 are movably suspended above the substrate 12 at a height above the substrate 12 defined by the thickness of the sacrificial layer 10. Portions of the layer 14 not shown in FIG. 1 deposited directly over the substrate 12 anchor and support the suspended portions of the layer 14 to the substrate 12. For example, the anchor portion of the layer 14 cantilevers the suspended portions over the substrate 12.

Figure 2:
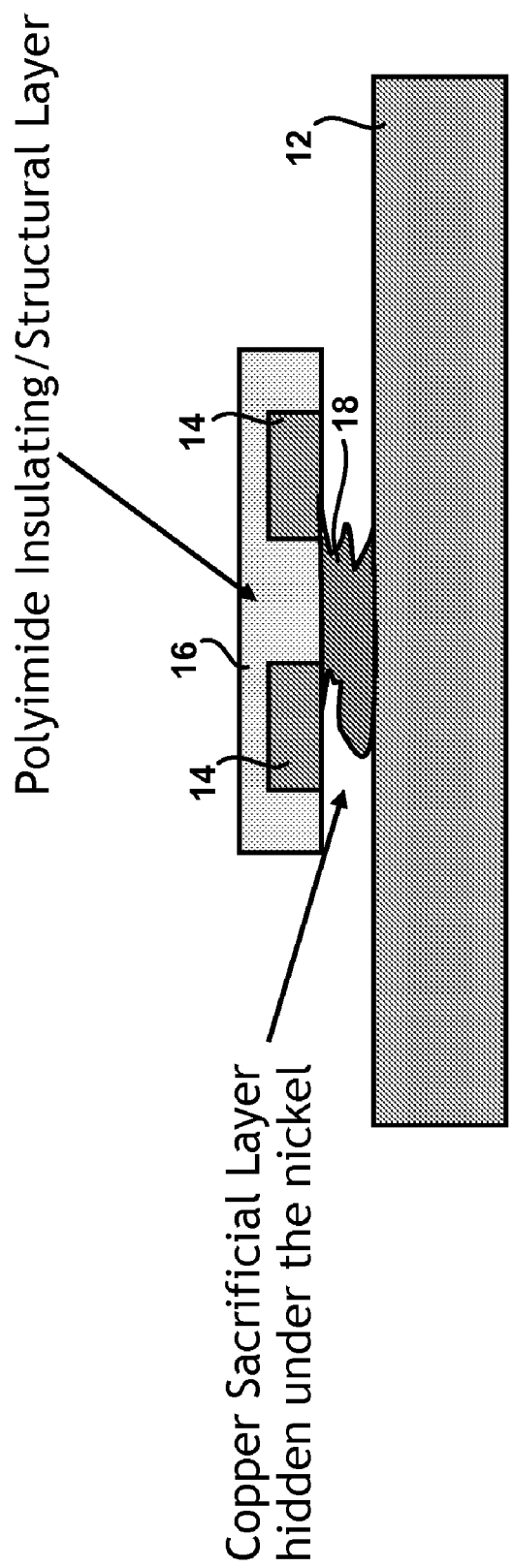
FIG. 2 illustrates incomplete release of the sacrificial layer shown in FIG. 1.

The sacrificial layer 10 may be removed by using any suitable removal technique, such as chemical etching. FIG. 2 illustrates a problem that may occur in removing the sacrificial layer 10. In FIG. 2, the sacrificial layer 10 has not been completely removed by the etching process, leaving a remnant 18 of conductive material that may electrically short together the sections of the layer 14 shown in FIG. 2 and may prevent them from moving appropriately in the finished MEMS device.

Figure 3:
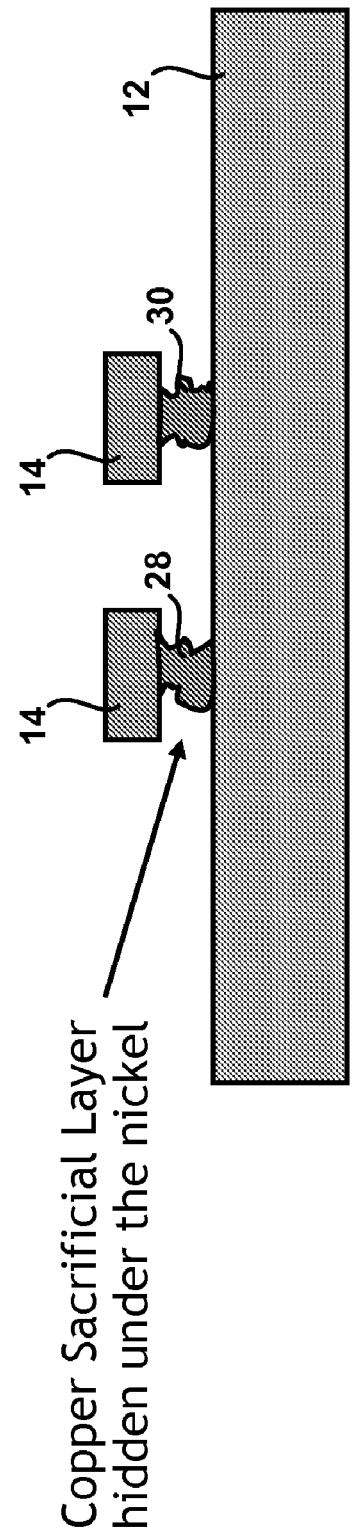
FIG. 3 shows incomplete release of a sacrificial layer in another partially completed structure formed in a typical micromachining process involving the use of sacrificial layers.

FIG. 3 shows a situation where no insulating layer 16 is used. In this case, the etching step has left two residues 28 and 30 of the sacrificial layer 10 underneath the two sections of conductive layer 14. Although there are no electrical shorts, the sections of layer 14 are anchored to the substrate 12 and substantially immobilized.

Test structures in accordance with this invention reliably detect the presence of residues of a sacrificial layer used in a micromachining process that have not been removed by etching or other removal technique. They preferably are located on the same substrate on which the actual MEMS parts are being fabricated. The test structures are placed so that incomplete removal of a sacrificial layer under the test structure in all likelihood would indicate the incomplete removal of the sacrificial layer under the actual MEMS part being fabricated. When such residues are detected, additional etching or other steps can be performed to completely remove the sacrificial layer.

Figure 4:
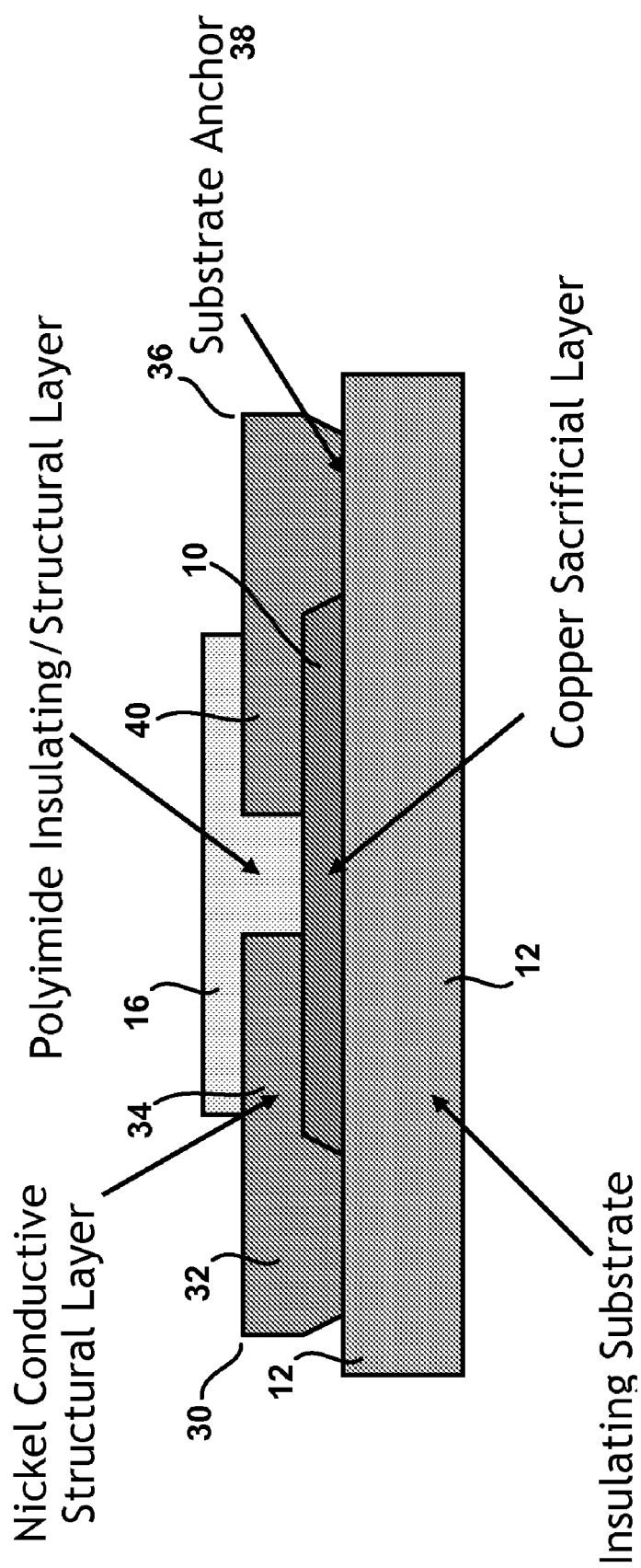
FIG. 4 depicts a side view of an illustrative test structure in accordance with the invention before removal of a sacrificial layer.

FIG. 4 is an exemplary test structure that electrically tests for the presence of a residual sacrificial conductive layer removed from a substrate during a micromachining process. The test structure of FIG. 4 is a mechanical bridge structure designed to have an open electrical path that is only closed by the residual conductive material left on the substrate 12 in the event of an incomplete release step. FIG. 4 shows this test structure prior to removal of the sacrificial layer 10 from the substrate 12. The test structure comprises a first conductive structural element 30 having a first anchor portion 32 fixed to the substrate 12. The first conductive structural element 30 also has bridge portion 34 extending from and supported by the anchor portion 32 and resting on the sacrificial layer 10. The bridge portion 34 is to be supported or cantilevered a predetermined distance above the substrate 12 by the anchor portion 32 after the removal of the sacrificial layer 10. The test structure also comprises a second conductive structural element 36 having a second anchor portion 38 fixed to the substrate 12 in a fashion similar to that of anchor portion 32. The second conductive structural element 36 also has bridge portion 40 extending from, and supported by, the anchor portion 38 and resting on the sacrificial layer 10. The bridge portion 40 is to be supported or cantilevered a predetermined distance above the substrate 12 by the anchor portion 38 after the removal of the sacrificial layer 10. Like the apparatus of FIG. 1, the test structure of FIG. 4 also comprises an insulating structural layer 16 that insulates the conductive structure 30 from the conductive structure 36.

Figure 5:
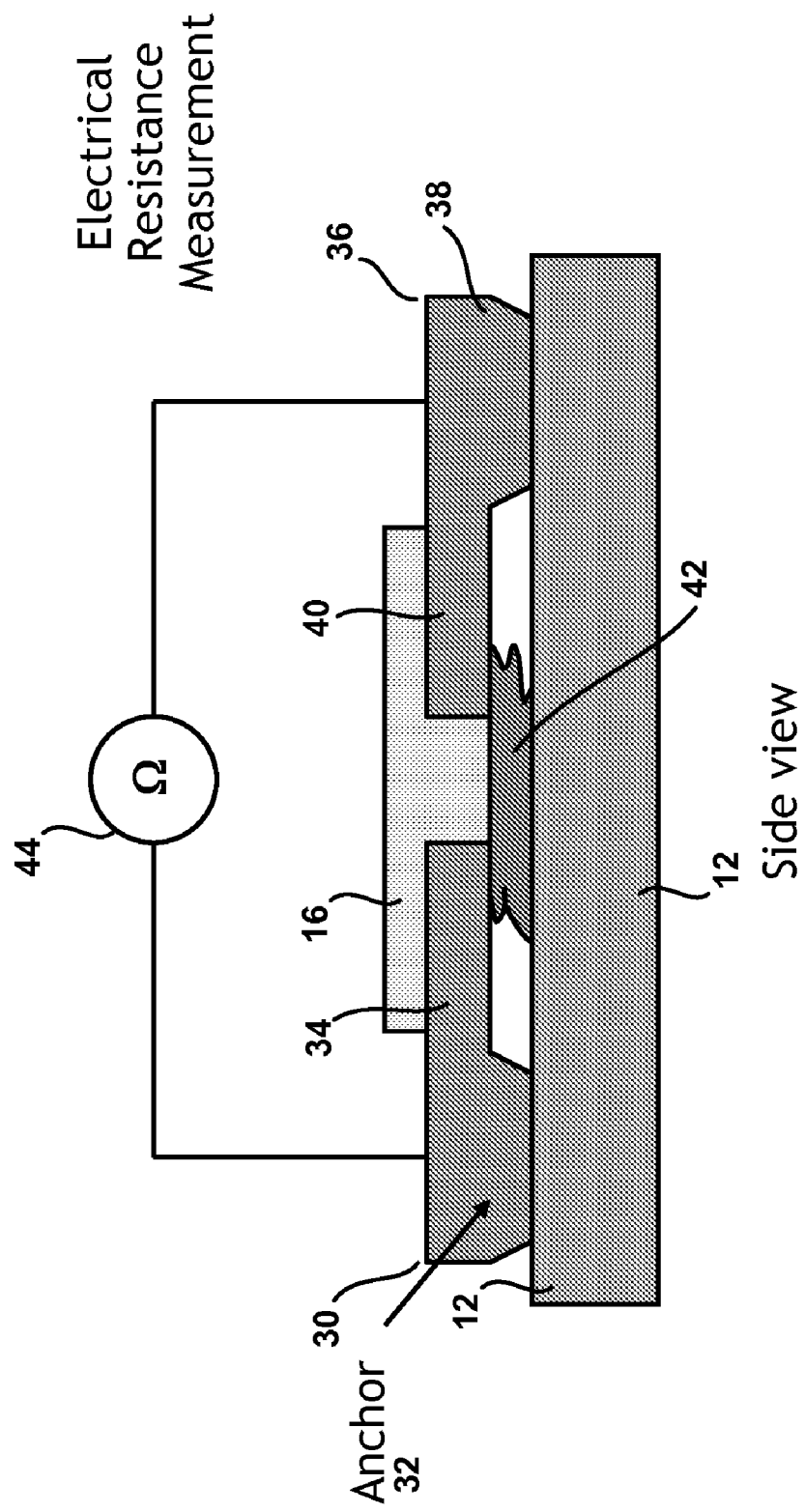
FIG. 5 depicts an illustrative test structure in accordance with the invention with an incomplete release of the sacrificial layer shown in FIG. 4 and detection of the presence of the residual sacrificial material.
Figure 6:
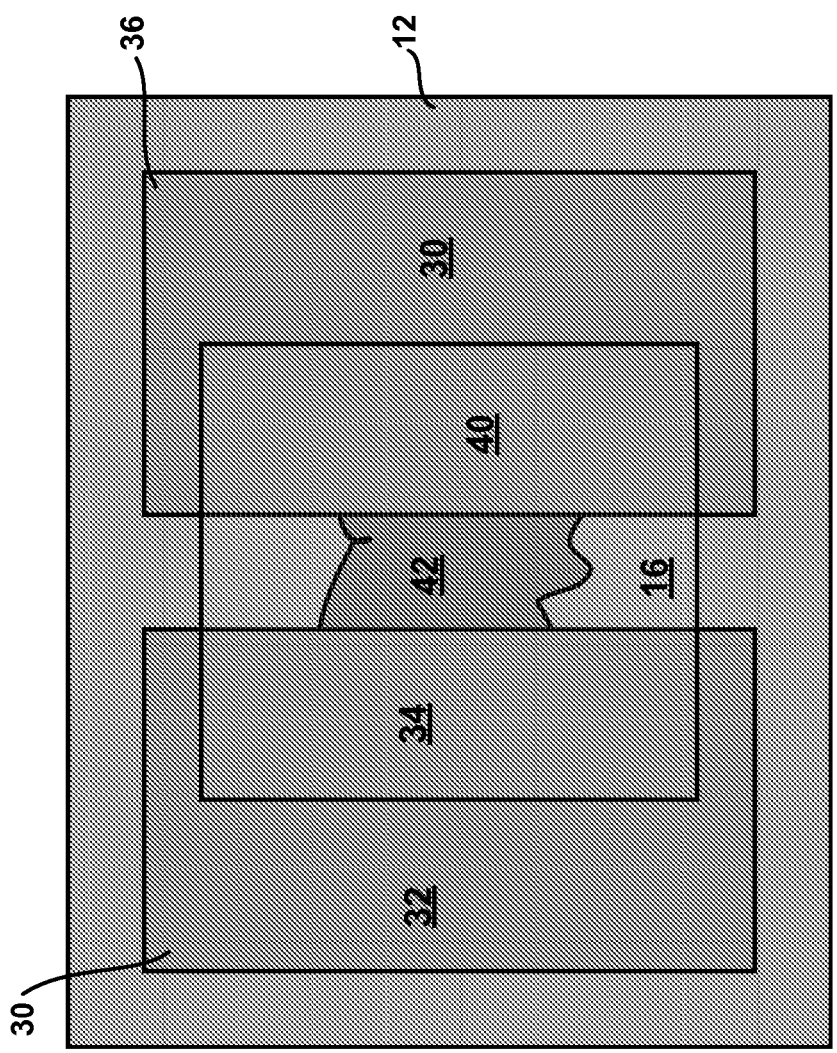
FIG. 6 is a top view of the test structure of FIG. 5.

FIG. 5 shows a side view, and FIG. 6 shows a top view, of the test structure of FIG. 5 after removal of the sacrificial layer 10. Due to an incomplete etching of the sacrificial layer 10, a residual portion 42 of the layer 10 remains under the bridge portions 34 and 40 and the insulating layer 16. This residual portion 42 not only interferes with the motion of the bridge portions 34 and 40, but it also electrically shorts the two bridge portions 34 and 40 together. This electrical short between portions 34 and 40, and the presence of the residual portion 42 indicating an incomplete release of the sacrificial layer 10, is detected by an electrical resistance measuring device 44 connected to structural elements 30 and 36 as shown in FIG. 6.

Figure 7:
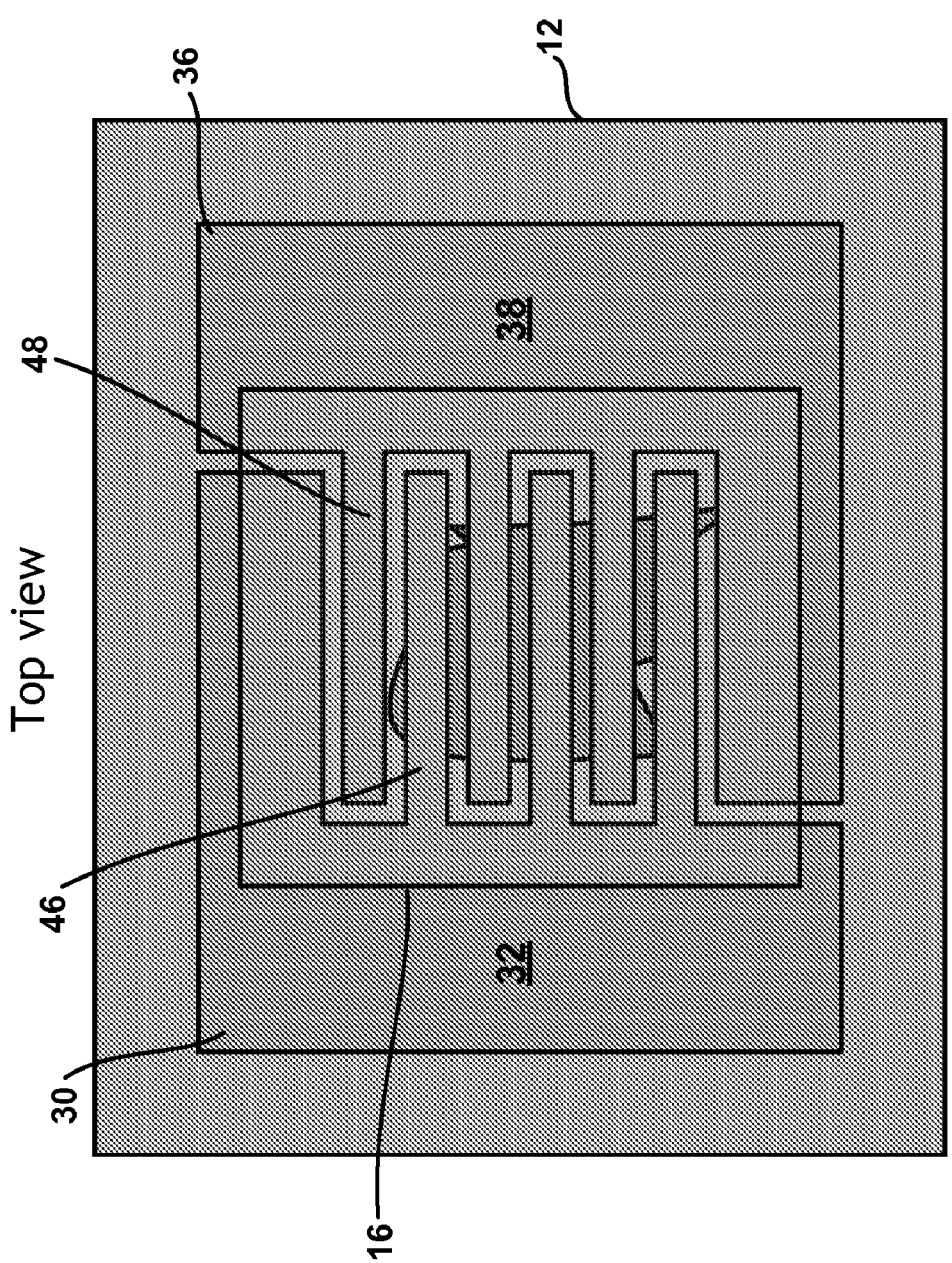
FIG. 7 is a top view of a preferred example of an electrical test structure involving interleaved conductive fingers that permit highly reliable electrical sensing of the presence of a sacrificial layer underneath conductive structural elements suspended over an insulating substrate.

FIG. 7 shows a preferred embodiment of an electrically based test structure that detects the presence of a residual piece of conductive sacrificial layer 10 remaining after an incomplete release of the sacrificial layer 10 by an etching step in a micromachining process. The structure of FIG. 7 involves an interdigitated finger-like structure that will increase the bridge width and decrease the chance of a false negative. The structure of FIG. 7 is similar to that of FIGS. 4 to 6, except that the bridge portion of the conductive structural element 30 comprises a row of narrow strips 46 of conductive material extending from the anchor portion 32 and suspended or cantilevered over the substrate 12; similarly, the bridge portion of the conductive structural element 36 comprises a row of narrow strips 48 of conductive material extending from the anchor portion 38 and suspended or cantilevered over the substrate 12. As shown in FIG. 7, the row 46 of conductive strips is separated from and insulated from the row 48 of conductive strips by the insulating layer 16. The interleaved finger-like strips 46 and 48 separated by the insulating layer 16 define an increased length serpentine interface between the two conductive elements 30 and 36 as compared with the interface between the conductive elements 30 and 36 shown in FIG. 6. This arrangement increases the likelihood of detecting small pieces of residual sacrificial layer as compared with the apparatus of FIG. 6.

Figure 8:
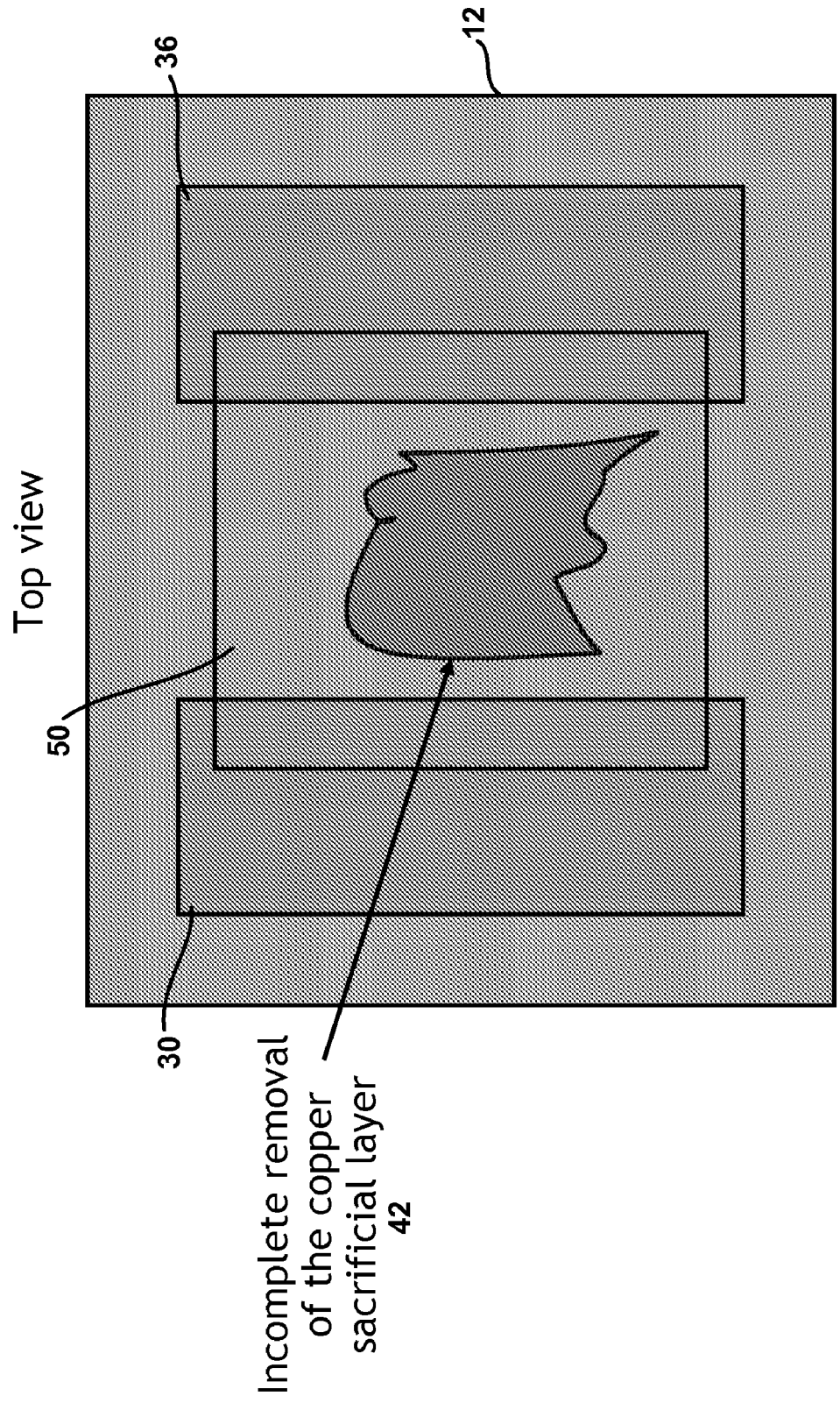
FIG. 8 is a top view of an illustrative visual test structure in accordance with the invention.

FIG. 8 shows a test apparatus for visually detecting the presence of residual sacrificial layer. If only a visual test structure is desired to evaluate the release of a MEMS sacrificial layer, the finger structure of FIG. 7 may be removed leaving only a transparent window 50 through the insulating layer 16 under which residue 42 can be visually observed. Although FIG. 8 shows two structural elements 30 and 36 supporting the window 50 above the substrate 12 and anchoring it to the substrate 12, only one such structural element is needed to support the window 50 above the substrate 12 in the FIG. 8 embodiment of the invention.

Figure 9:
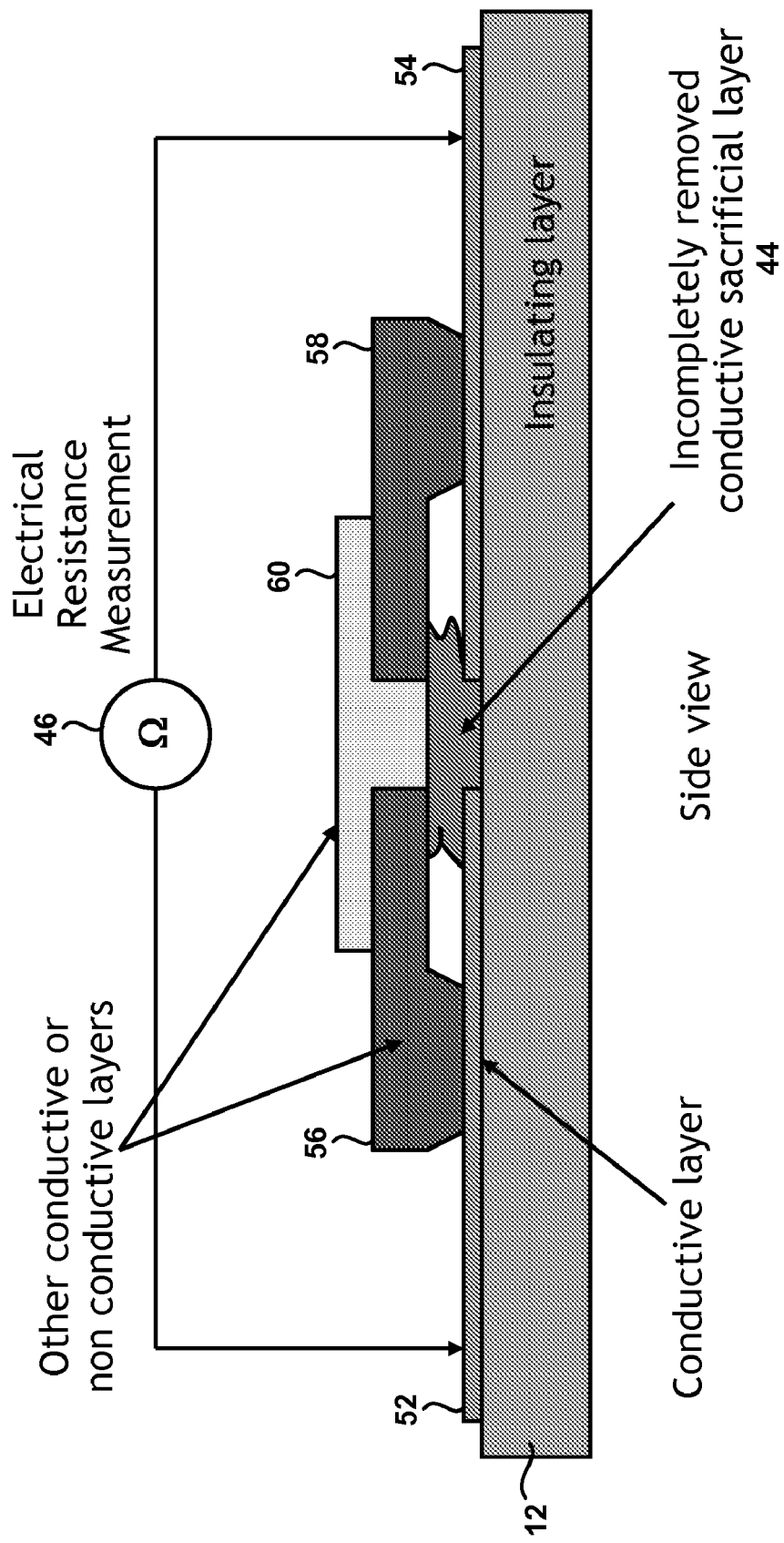
FIG. 9 is a side view of an illustrative test structure involving non-cantilevered conductive structures.

FIG. 9 is another embodiment of the invention involving electrical detection of conductive sacrificial layer residue. In the apparatus of FIG. 9, conductive layers 52 and 54 are formed on insulating substrate 12. The conductive layers 52 and 54 are separated and insulated from one another on the substrate 12. Preferably, conductive layers 52 and 54 include interdigitated fingers like those shown in FIG. 7. A conductive sacrificial layer, only a residue 44 of which is shown in FIG. 9, is formed over the conductive layers 52 and 54 so that they are shorted together by the sacrificial layer. The test structure of FIG. 9 also includes additional structural elements 56, 58, and 60 which may be electrically conductive or insulating and shaped similarly to that of elements 30, 36, and 16 described above. The electrical measuring device 46 in FIG. 9 is connected to conductive layers 52 and 54 and indicates the presence of residue 44 which shorts the layers 52 and 54 together when the sacrificial layer has not been completely removed. This also indicates that the movable MEMS parts are not likely to have been released. Although FIG. 9 shows two structural elements 52 and 54 supporting the insulating layer 60 and anchoring it to the substrate 12, only one such structural element is needed to support the layer 60 above the substrate 12 in the FIG. 9 embodiment of the invention.

It should be pointed out that any number and configuration of structural elements like those described above that suspend other structures above the substrate may be used depending on the MEMS structures being fabricated and the nature of the sacrificial layer being removed during the fabrication process.

The Title, Technical Field, Background, Summary, Brief Description of the Drawings, Detailed Description, and Abstract are meant to illustrate the preferred embodiments of the invention and are not in any way intended to limit the scope of the invention. The scope of the invention is solely defined and limited by the claims set forth below.

The invention claimed is:

1. A micro-electromechanical test apparatus, comprising:
an insulating substrate;
a first conductive structural element having a first anchor portion fixed to the substrate and a first bridge portion cantilevered from the anchor portion over the substrate;

a second conductive structural element insulated from the first conductive structural element and having a second anchor portion fixed to the substrate and a second bridge portion cantilevered from the second anchor portion over the substrate; and an electrical resistance measuring device connected to the first and second conductive structural elements adapted to detect the presence of an incompletely removed conductive sacrificial layer contacting the first and second conductive structural elements under the bridge portions.

2. The system of claim 1, in which the first bridge portion comprises a first plurality of conductive fingers and the second bridge portion comprises a second plurality of conductive fingers interleaved with the first plurality of conductive fingers.

3. The system of claim 1, further comprising:
a structural insulating layer situated between the first and second bridge portions.

4. A method of detecting the presence of an incompletely etched conductive sacrificial layer in a micromachining process, comprising the steps of:
forming an insulating substrate;
forming a first conductive structural element having a first anchor portion fixed to the substrate and a first bridge portion cantilevered from the anchor portion over the substrate;
forming a second conductive structural element insulated from the first conductive structural element and having a second anchor portion fixed to the substrate and a second bridge portion cantilevered from the second anchor portion over the substrate; and
detecting electrical resistance between the two conductive structural elements suspended above the insulating substrate to detect the presence of the incompletely etched conductive sacrificial layer contacting the first and second conductive structural elements under the bridge portions.

5. A micro-electromechanical test apparatus, comprising:
an insulating substrate;
a first conductive layer formed on the substrate;
a second conductive layer formed on the substrate and insulated from the first conductive layer;
a first structural element having a first anchor portion fixed to the first conductive layer and a first bridge portion cantilevered from the anchor portion over conductive layers and the substrate;
an electrical resistance measuring device connected to the first and second conductive layers adapted to detect the presence of an incompletely removed conductive sacrificial layer contacting the first and second layers under the bridge portion.

6. The apparatus of claim 5, further comprising:
a second structural element separated from the first structural element and having a second anchor portion fixed to the second conductive layer and a second bridge portion cantilevered from the second anchor portion over the substrate; and
a third structural element suspended above the substrate and separating the first and second structural elements.

* * * * *